United States Patent

Okada et al.

[11] Patent Number: 5,560,534
[45] Date of Patent: Oct. 1, 1996

[54] SOLDERING APPARATUS

[75] Inventors: Toru Okada; Kenji Iketaki; Naoki Yamasaki, all of Kawasaki, Japan

[73] Assignee: Fujitsu Limited, Kawasaki, Japan

[21] Appl. No.: 380,579

[22] Filed: Jan. 30, 1995

[30] Foreign Application Priority Data

Mar. 18, 1994 [JP] Japan .................................. 6-048708

[51] Int. Cl.⁶ ...................................................... H05K 3/34
[52] U.S. Cl. ............................................... 228/37; 228/43
[58] Field of Search .............................. 228/37, 43, 56.1, 228/180.1, 260; 118/423, 429; 427/123

[56] References Cited

U.S. PATENT DOCUMENTS 4,545,520  10/1995  Kent .......................................... 228/37

FOREIGN PATENT DOCUMENTS 6320261  11/1994  Japan ........................................ 228/37
565786   8/1977   U.S.S.R. ................................... 228/37

Primary Examiner—Samuel M. Heinrich
Attorney, Agent, or Firm—Armstrong, Westerman, Hattori, McLeland & Naughton

[57] ABSTRACT

A soldering apparatus wherein lead pins of a part inserted from above in through-holes of a printed circuit board are soldered to the through-holes from below. The soldering apparatus comprises a solder supplying nozzle, a preliminary heating nozzle and a flux nozzle. Each of the nozzles has an opening and a pair of slits formed to extend downwardly from the opening. The nozzles are moved upwardly and downwardly in a Z direction by respective elevators and are moved and positioned in X and Y directions by a moving table. A printed circuit board to which a lead part to be soldered is temporarily fastened is disposed on the nozzles. As the moving table and the elevators are controlled so that the lead pins projecting to the rear face of the printed circuit board pass through the slits of the nozzles from sidewardly, application of flux to and preliminary heating of the lead pins are performed, and soldering of the lead pins is performed with molten solder supplied to the opening at the upper portion of the solder supplying nozzle.

18 Claims, 21 Drawing Sheets

|  | ① | ② | ③ | ④ | ⑤ |
|---|---|---|---|---|---|
| Flux Generator | | | | | |
| Molten Solder Generator | | | | | |

|  |  | ① | ② | ③ | ④ | ⑤ |
|---|---|---|---|---|---|---|
| Warm Wind Generator |  |  |  |  |  |  |
| Molten Solder Generator |  |  |  |  |  |  |

|  | ① ② ③ ④ ⑤ |
|---|---|
| Flux Generator |  |
| Warm Wind Generator |  |
| Molten Solder Generator |  |

FIG. 14A
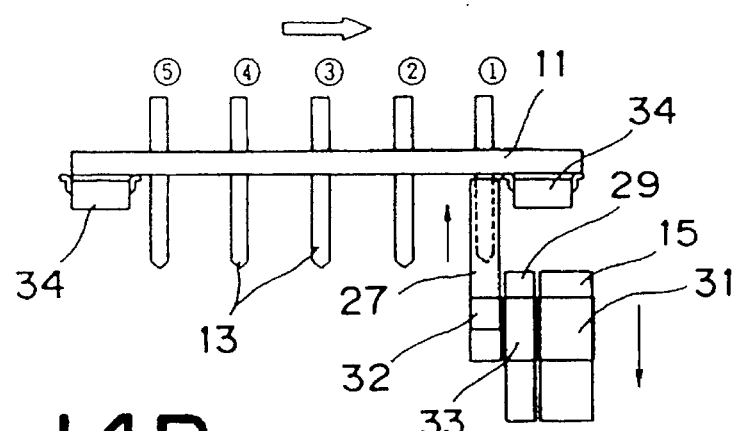
FIG. 14B
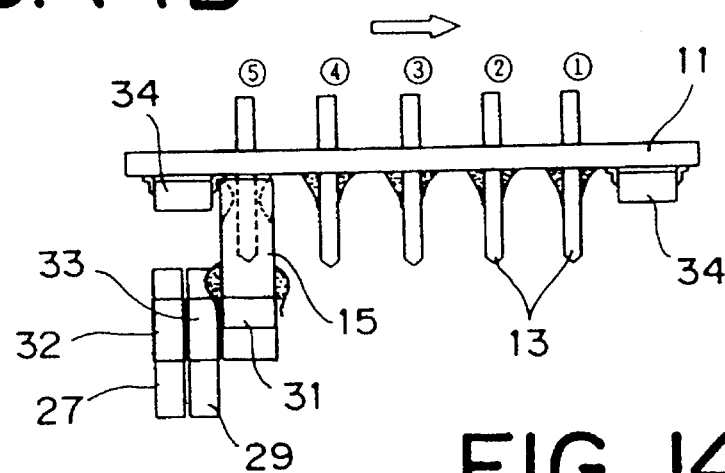
FIG. 14C
| | ① | ② | ③ | ④ | ⑤ |
|---|---|---|---|---|---|
| Flux Generator | | | | | |
| Warm Wind Generator | | | | | |
| Molten Solder Generator | | | | | |
| Flux Applying Nozzle Elevator | | | | | |
| Heating Nozzle Elevator | | | | | |
| Soldering Nozzle Elevator | | | | | |

SOLDERING APPARATUS

BACKGROUND OF THE INVENTION

1. Field of the Invention

This invention relates to a technique for automatically and selectively mounting a part onto a printed circuit board, and more particularly to a technique for automatically and selectively mounting, at a part mounting step for a printed circuit board, some parts individually onto the printed circuit board after electronic parts such as ICs or LSIs have been collectively mounted onto the printed circuit board using various part techniques.

2. Description of the Related Art

Mounting of post-mounting parts at a part mounting step for a printed circuit board is normally performed by hand. The reason is that a part already mounted acts as an obstacle or otherwise adversely affects heating involved in soldering operations, and this makes automation difficult. Such mounting by hand naturally includes a large number of operation steps and is low in efficiency, and causes an increase in personnel expenses and tends to cause incomplete soldering results.

Such an automatic soldering technique as illustrated in FIG. 20 is one of conventional well-known automatic soldering techniques used to solve the problem described above. Reference numeral 1 denotes a printed circuit board onto which post-mounting parts should be mounted, and the printed circuit board 1 is transported by a conveyor (not shown). Reference numeral 2 denotes a post-mounting part (for example, a multiple pin connector) having a plurality of lead pins 3. The post-mounting part 2 is temporarily fastened in a condition wherein the lead pins 3 thereof are inserted from above in through-holes formed in the printed circuit board 1.

Reference numeral 4 denotes a soldering nozzle. The soldering nozzle 4 has, at an upper portion thereof, an opening 5 in which all of the lead pins 3 of the post-mounting part 2 to be soldered can be inserted. Reference numeral 6 denotes a molten solder generator. Molten solder 7 is injected moderately from the opening 5 of the soldering nozzle 4 by the molten solder generator 6. The soldering nozzle 4 is moved in upward and downward directions by an elevator (not shown).

The printed circuit board 1 is transported by the conveyor to a position at which the post-mounting part 2 to be soldered corresponds to the soldering nozzle 4. Then, the soldering nozzle 4 is moved upwardly by the elevator as shown in FIG. 21A until all of the lead pins 3 of the post-mounting part 2 which project to the rear face side of the printed circuit board 1 are inserted into the opening 5 of the soldering nozzle 4. Thereafter, the soldering nozzle 4 is moved downwardly by the elevator as shown in FIG. 21B so that the lead pins 3 of the post-mounting part 2 are collectively soldered and secured to the corresponding through-holes of the printed circuit board 1.

Further, in order to ensure such good soldering results as described above, such as good wettability and so forth of the solder, application of flux, preliminary heating or some other pre-processing is required. Conventionally, the steps of application of flux, preliminary heating and soldering are performed by different apparatuses.

The prior art described above, however, has the following problems. In particular, it sometimes occurs that, as also seen from FIG. 21B, when the lead pins are drawn up from within the opening of the soldering nozzle, solder sticks across adjacent lead pins, resulting in a soldering failure, such as short-circuiting. This problem is particularly remarkable where a post-mounting part is a multiple pin connector having a plurality of lead pins or a like electric device, and it is considered that the problem arises from the fact that, since a flow of molten solder is retarded and cooled by a plurality of lead pins at a location at or around a central portion of the opening of the soldering nozzle, the viscosity of the molten solder increases at that location.

Further, according to the prior art, a soldering nozzle for exclusive use for a post-mounting part which makes an object for soldering must be used as the soldering nozzle, and this lacks in universality. Accordingly, the prior art also has a problem in that it cannot flexibly cope with a change of an object part necessitated by a change of design or the like and much time is required for an exchanging operation of the soldering nozzle.

Furthermore, since the flux application step and the preliminary heating step for assuring high wettability of solder and so forth are performed by different independent apparatuses independently of the soldering step, there is a further problem in that the entire system has a great size and requires a high cost.

Meanwhile, since a nozzle for application of flux and a preliminary heating nozzle for exclusive use for a post-mounting part which makes an object for soldering are used for the flux application step and the preliminary heating step similarly as the soldering nozzle described above, they must be replaced upon changing of the setup necessitated upon changing of the model to be manufactured. Accordingly, there is a still further problem in that, in a manufacturing line for manufacturing a small quantity each of a large number of models, much time is required for replacement or adjustment of the nozzles and manual operation is always required.

SUMMARY OF THE INVENTION

Accordingly, it is an object of the present invention to provide a soldering apparatus which can minimize soldering failure such as short-circuiting at a step for soldering a post-mounting part to a printed circuit board.

It is another object of the present invention to provide a soldering apparatus which can flexibly cope with a part which makes an object for soldering irrespective of the type of the part.

It is a further object of the present invention to provide a soldering apparatus which is minimized in size and is high in efficiency in soldering.

In accordance with one aspect of the present invention, there is provided a soldering apparatus wherein lead pins of a part inserted from above in through-holes of a printed circuit board are soldered to the through-holes from below, comprising pin spot soldering means having, at an upper portion thereof, an opening for injecting molten solder therethrough and a slit extending downwardly from the opening in such a manner as to allow the lead pins to pass therethrough from sidewardly, molten solder supplying means for supplying molten solder to the opening of the pin spot soldering means, moving means for moving and positioning a relative position of the pin spot soldering means to the printed circuit board, and controlling means for controlling the movement by the moving means in accordance with circuit board data regarding the printed circuit board.

The circuit board data are data regarding the types and the positions (including the positions of the individual lead pins) of a post-mounting part or parts and also include, when necessary, data regarding the types and/or the positions of other parts mounted on the printed circuit board. The pin spot soldering means may include a barrier located in the inside of the opening and open only at a portion thereof adjacent the slit and at the top thereof. The soldering apparatus may further comprise preliminary heating nozzle means disposed adjacent the pin spot soldering means and having, at an upper portion thereof, an opening for injecting a warm wind therethrough and a slit extending downwardly from the opening in such a manner as to allow the lead pins to pass therethrough from sidewardly, preliminary heating heater means for supplying a warm wind to the opening of the preliminary heating nozzle means, flux applying nozzle means disposed adjacent the pin spot soldering means or the preliminary heating heater means and having, at an upper portion thereof, an opening for supplying flux therethrough and a slit extending downwardly from the opening in such a manner as to allow the lead pins to pass therethrough from sidewardly, and flux supplying means for supplying flux to the opening of the flux applying nozzle means. Preferably, each of the pin spot soldering means, the flux applying nozzle means and the preliminary heating nozzle means has a pair of slits, and all of the slits are arranged linearly.

The moving means may have various constructions. For example, the moving means may include elevating means for moving the pin spot soldering means, the flux applying nozzle means and the preliminary heating nozzle means independently of one another in a vertical one-axis direction, X-Y table means for moving them integrally in horizontal two-axis directions, or conveyor means for transporting the printed circuit board to a predetermined position. Meanwhile, the soldering apparatus may further comprise sensor means disposed adjacent the pin spot soldering means for detecting presence or absence of an obstacle including a part mounted on a lower face of the printed circuit board, and the controlling means may control the moving means so that the pin spot soldering means, the flux applying nozzle means or the preliminary heating nozzle means may not collide with the obstacle.

As described hereinabove, the prior art has the problem of short-circuiting between lead pins since all of the lead pins of the post-mounting part are collectively moved vertically into and out of molten solder in units of one part to solder the lead pins. Here, this problem is eliminated if, for example, the soldering nozzle is formed with a reduced size and lead pins of a post-mounting part are soldered one-by-one. However, since positioning in the vertical direction (directions in which the soldering nozzle is moved toward and away from the printed circuit board) with respect to each lead pin is necessitated without fail upon soldering of the lead pin, a new problem arises in that much time is required for soldering of the entire post-mounting part. Therefore, according to the present invention, pin spot soldering means having a slit which extends downwardly from an opening for injecting molten solder therethrough and allows the lead pins to pass therethrough from sidewardly is adopted to achieve minimization of the soldering nozzle while minimizing the loss of the soldering time. In particular, soldering can be performed by sidewardly introducing the lead pins of the part to be soldered into the opening of the pin spot soldering means by way of the slit and then sidewardly retracting them.

Accordingly, the lead pins can be soldered successively without positioning a lead pin in the vertical direction upon positioning of the lead pin relative to the pin spot soldering means. Consequently, molten solder of a high temperature can always be supplied to or around a base end portion of a lead pin without requiring much time for the entire soldering operation, and good soldering can be achieved while suppressing short-circuiting between lead pins to the minimum. It is to be noted that the pin spot soldering means preferably has a pair of slits disposed at symmetrical positions with respect to a center axis of the pin spot soldering means in the vertical direction.

Meanwhile, where the leads of the post-mounting part are long, the slit must also be formed correspondingly. However, since molten solder will also flow out through the slit, it is supposed that the molten solder may not sufficiently come to a position required for soldering. In this instance, the pin spot soldering means is provided with a barrier located in the inside of the opening of the pin spot soldering means and open only at a portion thereof adjacent the slit and at the top thereof. With such a barrier provided, the molten solder in the inside of the barrier is prevented from flowing out directly through the slit before it comes to the opening at the upper portion of the pin spot soldering means, and consequently, molten solder of a high temperature can be supplied sufficiently to a position at which soldering is required.

Further, according to the present invention, since the moving means is controlled based on the circuit board data regarding the printed circuit board, the soldering apparatus can cope with various post-mounting parts flexibly by way of a change of the circuit board data, that is, in response to an on-line instruction to the controlling means. Accordingly, there is no need for performing a change of the setup such as replacement of the pin spot soldering means, and the soldering apparatus is very efficient in this regard. Further, if flux applying nozzle means or preliminary heating nozzle means which has a slit extending downwardly from an opening similarly to the pin spot soldering means is provided, such means can also be reduced in size similarly to the pin spot soldering means and can be all constructed very compact, and consequently, minimization, improvement in efficiency and reduction in cost of the system can be achieved.

By the way, in automatic soldering of a post-mounting part, it sometimes occurs that a different part is already mounted on the printed circuit board or a different part is mounted also on a lower face of the printed circuit board (the face to which the lead pins of a post-mounting part to be soldered project). In this instance, if the flux applying nozzle means and the preliminary heating nozzle means are provided adjacent the pin spot soldering means, the different part may provide an obstacle to soldering of the post-mounting part. In this instance, soldering can be performed to avoid the obstacle by employing elevating means which can move the pin spot soldering means, the flux applying nozzle means and the preliminary heating nozzle means independently of one another and moving them upwardly and downwardly independently of one another based on data of the different part in the circuit board data of the object printed circuit board.

It is to be noted that, since it may possibly occur that the circuit board data and the position of an actually mounted part may be different from one other, in order to prevent possible collision of the pin spot soldering means or some other means with the obstacle, sensor means such as an optical sensor is preferably employed to detect the presence or absence of such an obstacle.

The above and other objects, features and advantages of the present invention and the manner of realizing them will

BRIEF DESCRIPTION OF THE DRAWINGS

FIGS. 14A and 14B are schematic views illustrating movement control of the seventh embodiment of the present invention;

FIG. 14C is a timing diagram illustrating operation timings of different members of the seventh embodiment of the present invention;

DESCRIPTION OF THE PREFERRED EMBODIMENTS

Figure 1:
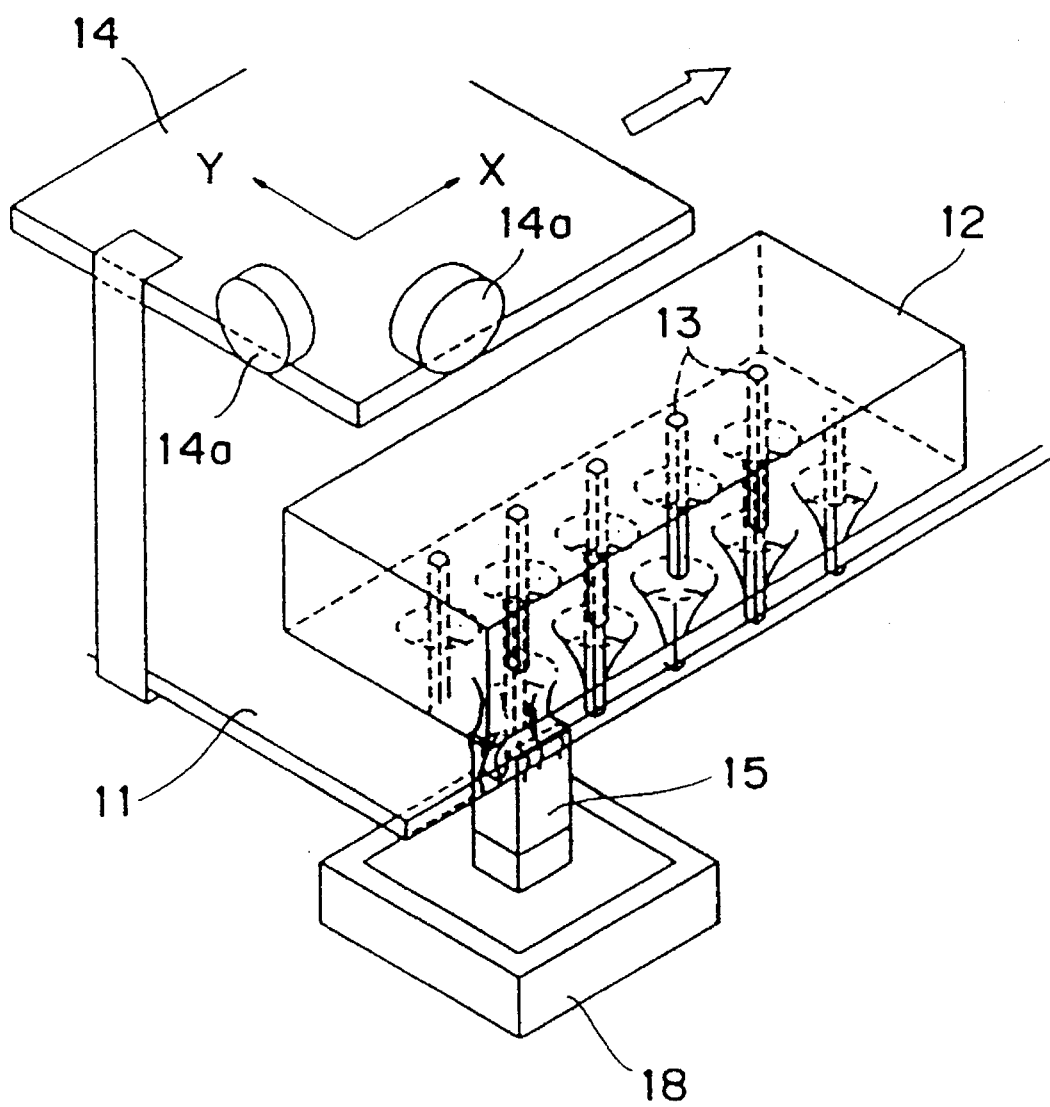
FIG. 1 is a perspective view showing the construction of a first embodiment of the present invention.

FIG. 1 is a perspective view showing a general construction of a first embodiment of the present invention. Referring to FIG. 1, reference numeral 11 denotes a printed circuit board onto which parts should be mounted, and 12 denotes a post-mounting part (for example, a multiple pin connector) having a plurality of lead pins 13. The post-mounting part 12 is temporarily fastened to the printed circuit board 11 in a condition wherein the lead pins 13 thereof are inserted from above in through-holes formed in the printed circuit board 11. Reference numeral 14 denotes an X-Y table having drive motors 14a and 14b thereon. The X-Y table 14 is an apparatus for moving and positioning the printed circuit board 11 in horizontal two-axis directions (X direction and Y direction) and is controlled by controlling means (not shown). Reference numeral 15 denotes a pin spot soldering nozzle. The pin spot soldering nozzle 15 has a size and a shape corresponding to one lead pin of the post-mounting part 12, and as shown in FIG. 2A, it has, at an upper portion thereof, an opening 16 for injecting molten solder therethrough and a pair of slits 17 extending downwardly from the opening 16. The slits 17 are formed so that the lead pins 13 of the post-mounting part 12 may pass sidewardly therethrough.

Figure 3:
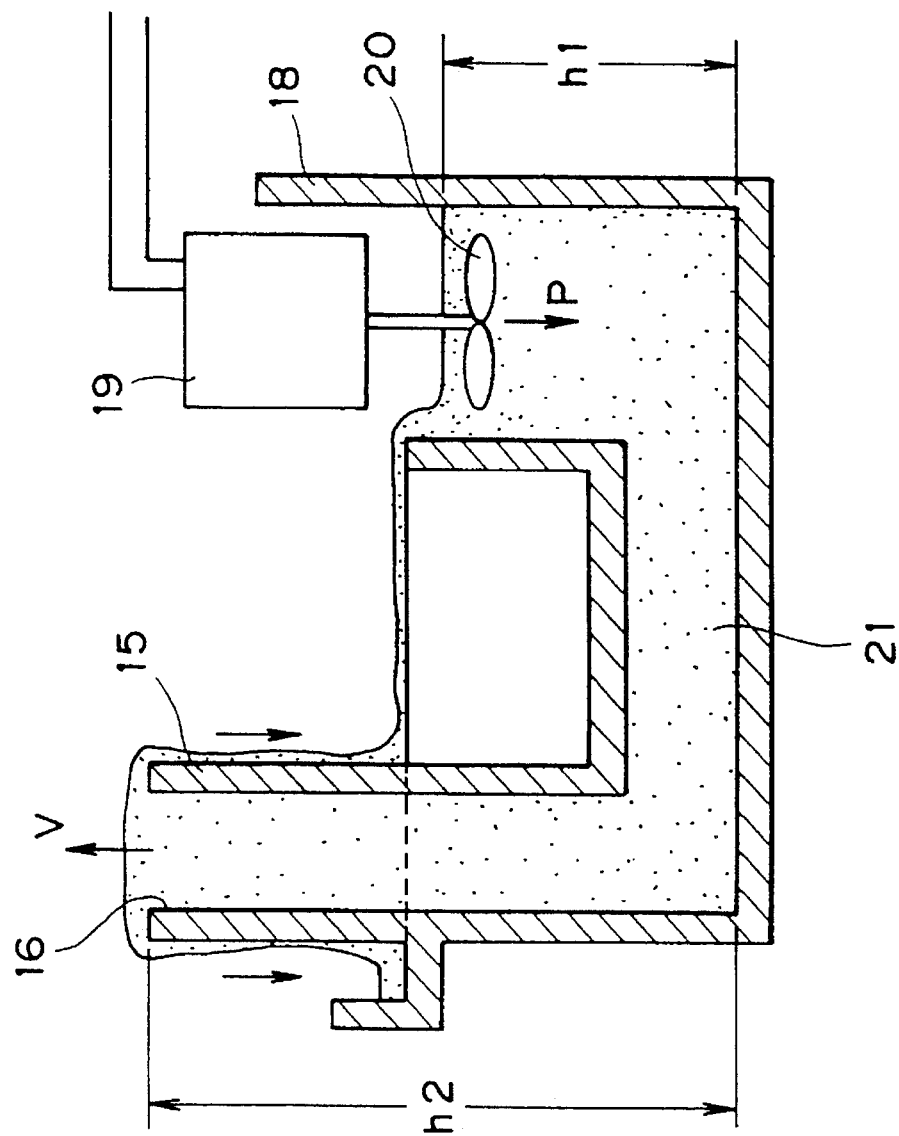
FIG. 3 is a sectional view showing details of a molten solder generator in the first embodiment of the present invention.

Referring to FIG. 1, reference numeral 18 denotes a molten solder generator, and the molten solder generator 18 is constructed in a manner as shown in FIG. 3. The molten solder generator 18 moderately injects, by driving a screw 20 rotated by a motor 19, molten solder 21 through the opening 16 of the pin spot soldering nozzle 15. The molten solder 21 injected from the opening 16 is circulated by the motor 19 and the screw 20. It is to be noted that the injection velocity V of the molten solder 21 from the opening 16 is given, where the height of the head of the molten solder 21 at the screw 20 is represented by h1, the height of the head at the opening 16 is represented by h2, the pressure by the screw 20 is represented by P, the mass of the molten solder 21 is represented by w, and the gravitational acceleration is represented by g, by the following equation:

$$h1 + P/w = h2 + V^2/2g$$

Accordingly, the injection velocity V can be adjusted by varying the pressure P, that is, by varying the speed of rotation of the motor 19.

Figure 4A:
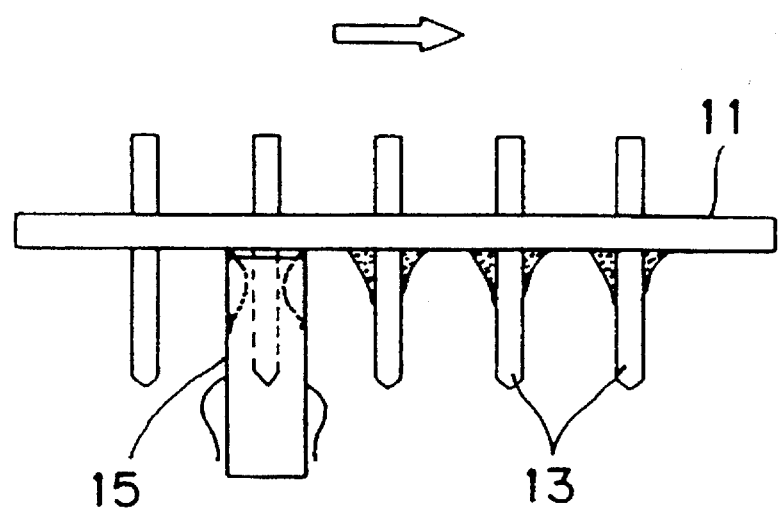
FIG. 4A is a front elevational view showing a manner of soldering individual lead pins in the first embodiment of the present invention.
Figure 4B:
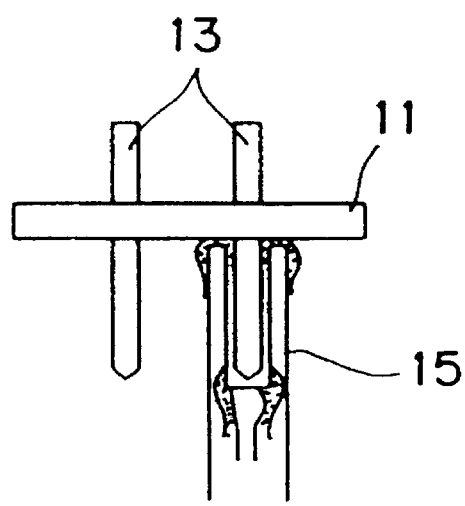
FIG. 4B is a side elevational view showing a manner of soldering the individual pins in the first embodiment of the present invention.

On the other hand, the controlling means controls the X-Y table 14 based on circuit board data (data representing the position of the post-mounting part 12 and/or the positions of the lead pins 13 of the post-mounting part 12) to move the printed circuit board 11 so that the lead pins 13 may pass through the slits 17 of the pin spot soldering nozzle 15. Consequently, as shown in FIGS. 4A and 4B, the molten solder injected from the opening 16 by the molten solder generator 18 sticks to a lead pin 13 and a corresponding through-hole of the printed circuit board 11 to solder them to one other.

In accordance with the present embodiment, since the lead pins 13 of the post-mounting part 12 pass one-by-one through each slit 17 of the pin spot soldering nozzle 15 and are soldered, the solder will not stick to and between two adjacent lead pins 13, and good soldering of the lead pins 13 is achieved. Further, the pin spot soldering nozzle 15 need not be moved upwardly and downwardly for each of the lead pins 13, and consequently, soldering of the lead pins 13 can be performed at a comparatively high rate.

By the way, the pin spot soldering nozzle 15 described above is suitable to post-mounting parts 12 which have comparatively short lead pins 13. If the lead pins 13 of the post-mounting part 12 are comparatively long, there is the possibility that molten solder may flow out from the lower side of a slit 17 and may not reach the opening 16 sufficiently.

Figure 2C:
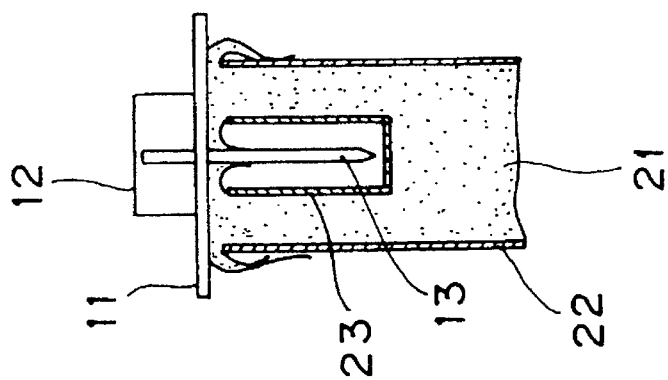
FIG. 2C is a sectional view showing a manner of soldering using the another soldering nozzle of the first embodiment of the present invention.
Figure 2B:
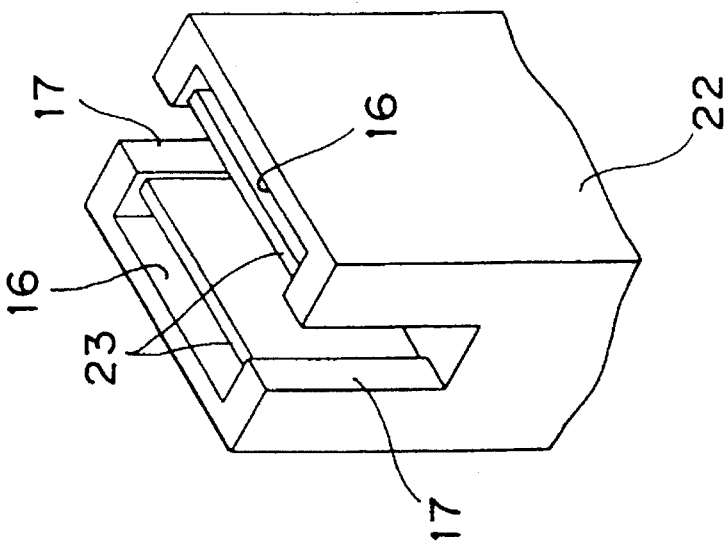
FIG. 2B is a perspective view showing the construction of another soldering nozzle of the first embodiment of the present invention.
Figure 2A:
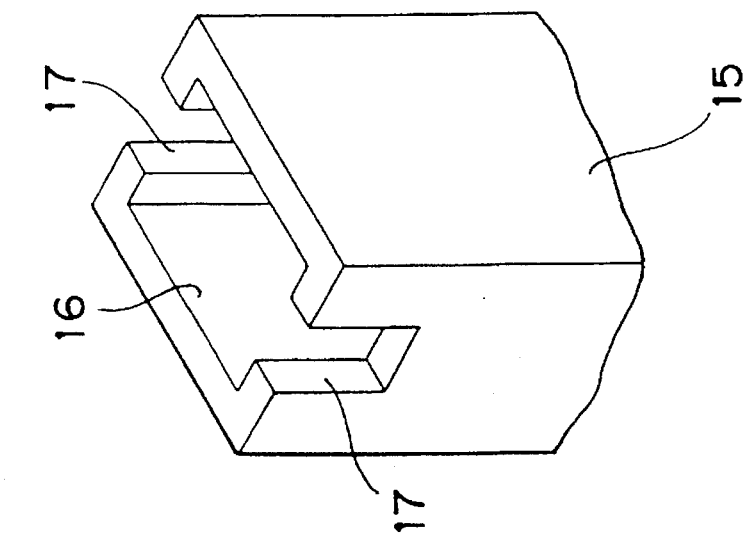
FIG. 2A is a perspective view showing the construction of a soldering nozzle of the first embodiment of the present invention.

In an instance, such a pin spot soldering nozzle 22 such as that shown in FIGS. 2B and 2C may preferably be adopted. In particular, the pin spot soldering nozzle 22 has a barrier 23 located in the inside of the opening 16 and having a substantially U-shaped cross section with only portions thereof adjacent the pair of slits 17 and the top portion thereof open. Due to the presence of the barrier 23, the molten solder 21 generated by the molten solder generator 18 is prevented from branching into two flows adjacent the opening 16 and flowing out from the slits 17 without reaching the opening 16. Accordingly, the lead pins 13 will pass through the insides of the slits 17 of the pin spot soldering nozzle 22 and the barrier 23, and the molten solder 21 is supplied efficiently to the base end portion sides of the lead pins 13. Consequently, good soldering can be achieved.

Figure 5:
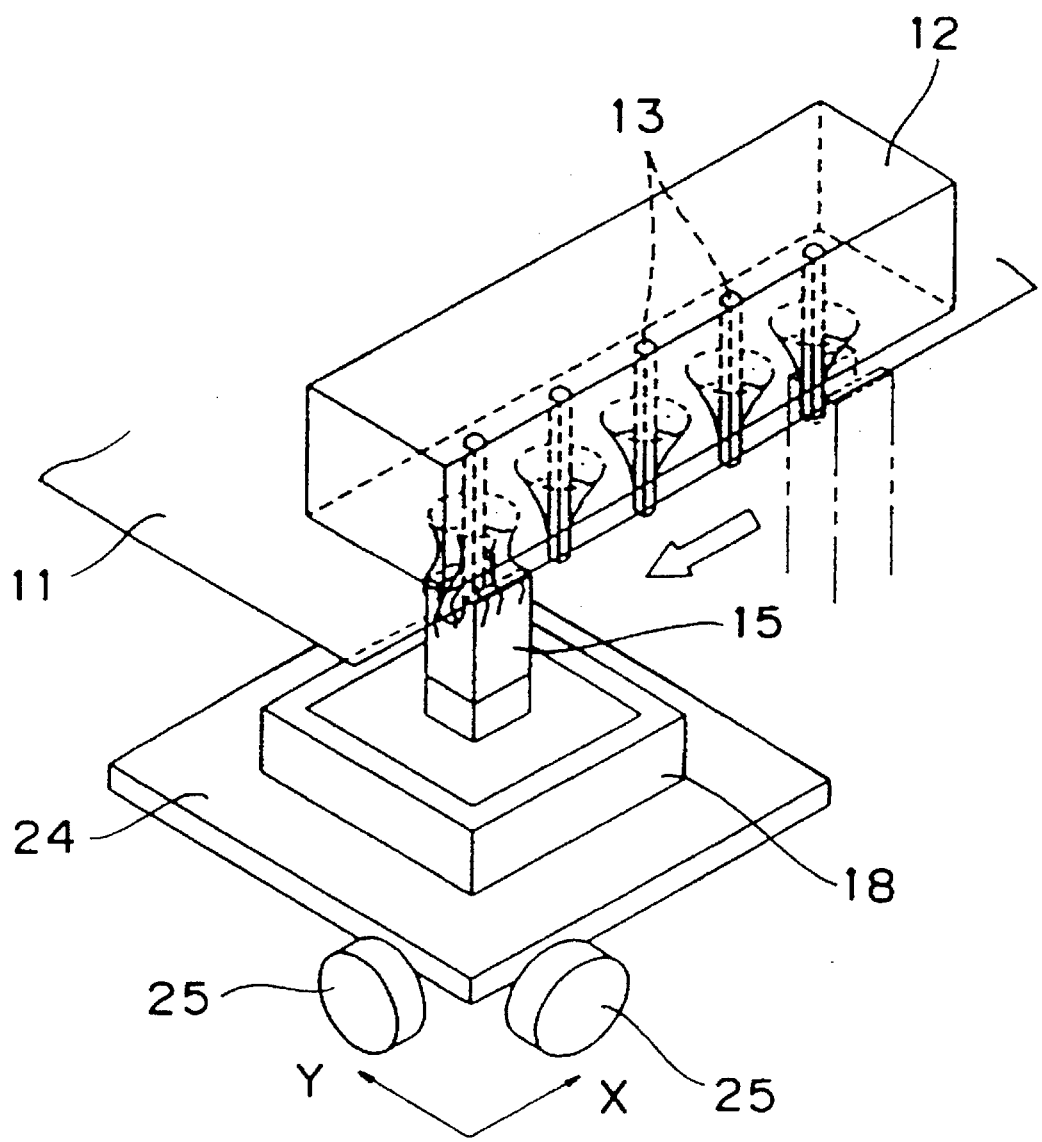
FIG. 5 is a perspective view showing the construction of a second embodiment of the present invention.

FIG. 5 is a view showing the construction of a second embodiment of the present invention. Substantially the same components as those of the first embodiment described above are denoted by same reference numerals, and description of them is omitted herein. While, in the first embodiment described above, soldering by the pin spot soldering nozzle 15 is performed while the printed circuit board 11 is moved by the X-Y table 14, in the present embodiment, an X-Y table 24 is provided for moving the pin spot soldering nozzle 15 and the molten solder generator 18 in horizontal two-axis directions (X direction and Y direction). Reference numeral 25 denotes a drive motor. The other constructions and effects are similar to those of the first embodiment described above.

Figure 6:
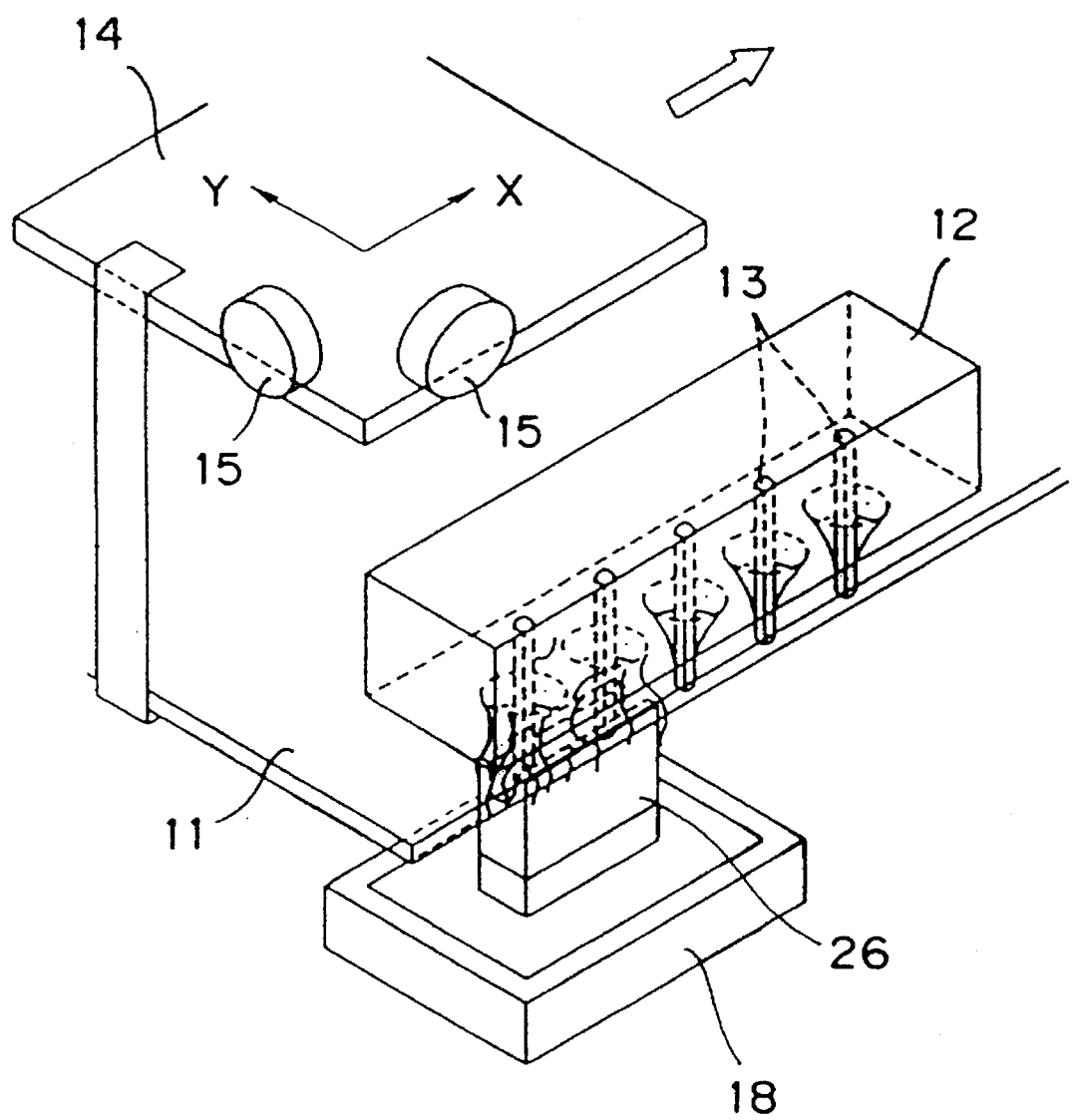
FIG. 6 is a perspective view showing the construction of a third embodiment of the present invention.

FIG. 6 is a view showing the construction of a third embodiment of the present invention. Substantially the same components as those of the first embodiment described above are denoted by same reference numerals, and description of them is omitted herein. While, in the first embodiment described above, the pin spot soldering nozzle 15 is constructed so as to correspond to one lead pin of the post-mounting part 12, a pin spot soldering nozzle 26 in the present embodiment is constructed so as to correspond to some (two in FIG. 6) of the lead pins 13 of the post-mounting part 12. A few lead pins would not cause retardation of a flow of injected molten solder and hence would not cause short-circuiting between the post-mounting part 12. Accordingly, even if the speed of movement of the printed circuit board 11 is increased, the molten solder will contact sufficiently with a portion for soldering, and good soldering can be achieved. Consequently, the overall time required for soldering can be decreased.

Figure 7:
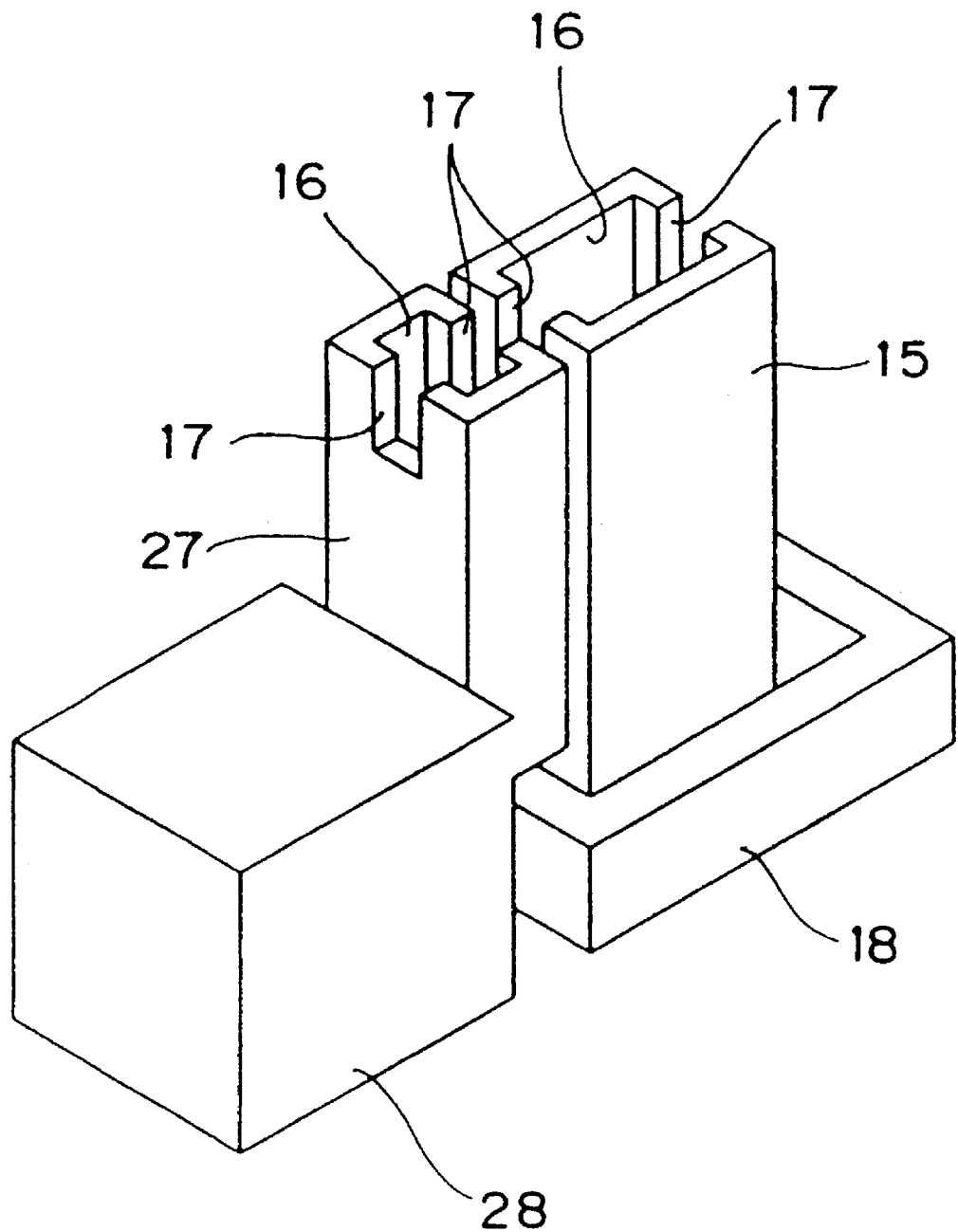
FIG. 7 is a perspective view showing the construction of a fourth embodiment of the present invention.

FIG. 7 is a view showing the construction of a fourth embodiment of the present invention. Substantially the same components as those of the first embodiment described above are denoted by same reference numerals, and description of them is omitted herein. While, in the first to third embodiments described above, the soldering apparatus has a construction only for soldering, in most cases, flux is applied before soldering in order to activate a portion to be soldered (that is, in order to improve the wettability with solder). Therefore, in the present embodiment, a flux applying nozzle 27 and a flux generator (fluxer) 28 are provided adjacent the pin spot soldering nozzle 15.

Figures 8A, 8B:
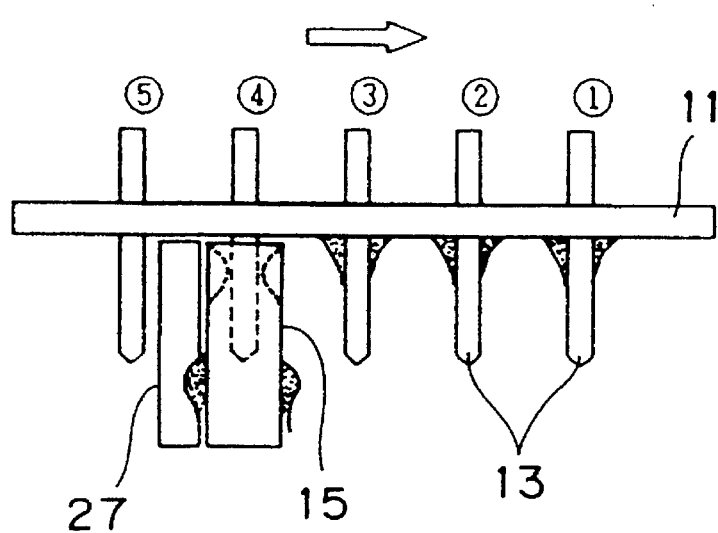
FIG. 8A is a schematic view illustrating movement control of the fourth embodiment of the present invention.
FIG. 8B is a timing diagram illustrating operation timings of different members of the fourth embodiment of the present invention.

The flux applying nozzle 27 has a construction similar to that of the pin spot soldering nozzle 15 shown in FIG. 2a and has, at an upper portion thereof, an opening 16 and a pair of slits 17 extending downwardly from the opening 16. Flux is supplied from the flux generator 28 to the opening 16 of the flux applying nozzle 27 by way of the inside of the flux applying nozzle 27. The slits 17 of the pin spot soldering nozzle 15 and the slits 17 of the flux applying nozzle 27 are arranged linearly as shown in FIG. 7. Control of the movement of the printed circuit board 11 by the X-Y table 14 and the operations of the molten solder generator 18 and the flux generator 28 is performed such that, as shown in FIGS. 8A and 8B, a lead pin 13 to be soldered passes the inside of the flux applying nozzle 27 prior to the pin spot soldering nozzle 15.

Due to the construction, soldering is performed for each of the lead pins 13 of the post-mounting part 12 immediately after flux is applied to it. Consequently, the solder wettability is improved, and good soldering can be achieved.

Figure 9:
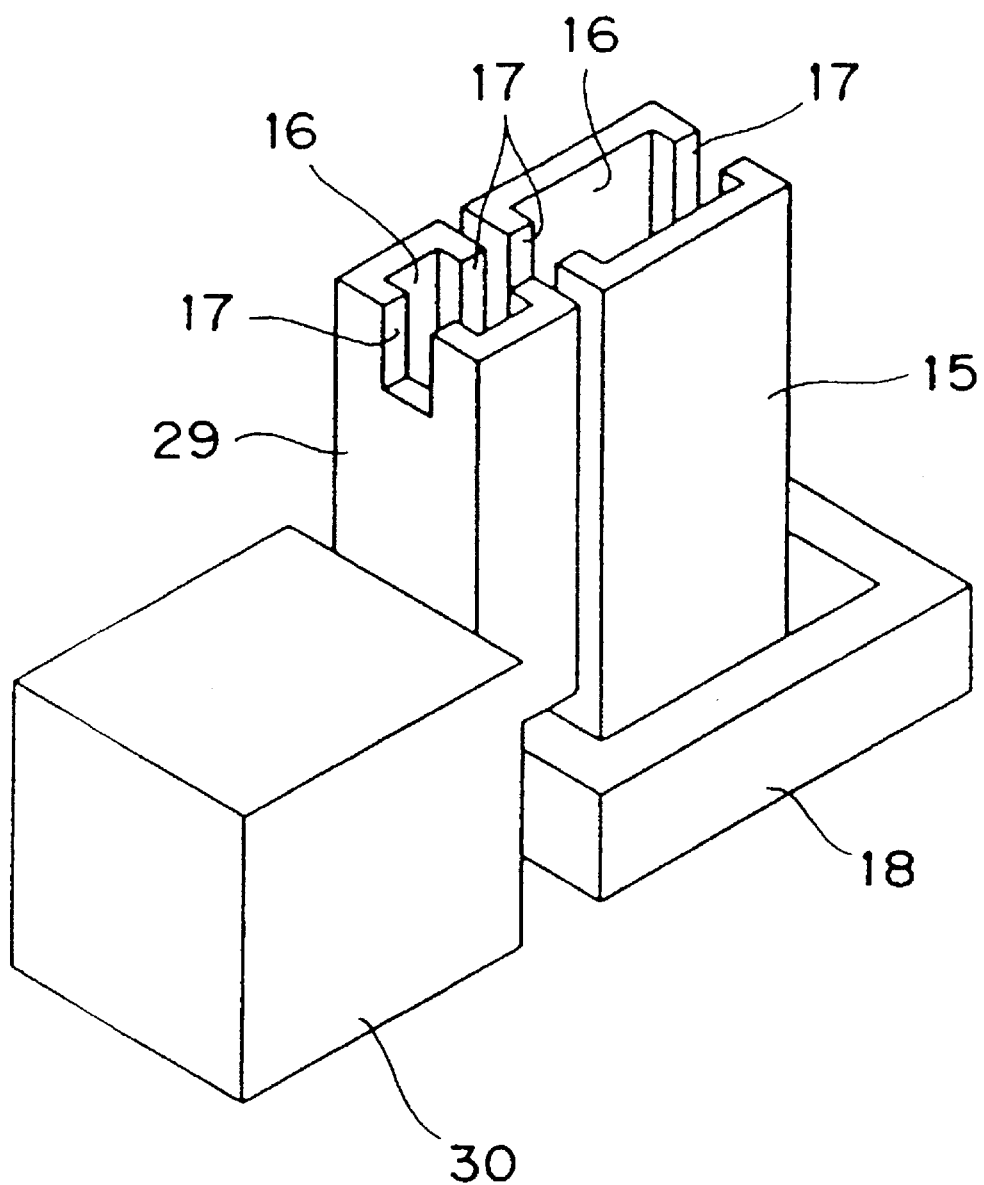
FIG. 9 is a perspective view showing the construction of a fifth embodiment of the present invention.

FIG. 9 is a view showing the construction of a fifth embodiment of the present invention. Substantially the same components as those of the first embodiment described above are denoted by same reference numerals, and description of them is omitted herein. While, in the first to third embodiments described above, the soldering apparatus has a construction only for soldering, in some cases, a portion to be soldered is preliminarily heated to a predetermined temperature before soldering in order to improve the wettability with solder of the portion to be soldered. To this end, in the present embodiment, a preliminary heating nozzle 29 and a warm wind generator (heater) 30 are provided adjacent the pin spot soldering nozzle 15.

Figures 10A, 10B:
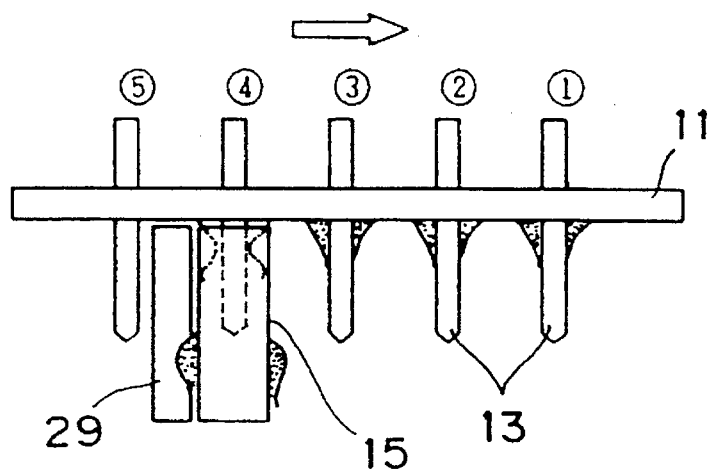
FIG. 10A is a schematic view illustrating movement control of the fifth embodiment of the present invention.
FIG. 10B is a timing diagram illustrating operation timings of different members of the fifth embodiment of the present invention.

The preliminary heating nozzle 29 has a construction similar to that of the pin spot soldering nozzle 15 shown in FIG. 2A and has an opening at an upper portion thereof and a pair of slits 17 extending downwardly from the opening 16. A warm wind is supplied from the warm wind generator 30 to the opening 16 of the preliminary heating nozzle 29 through the inside of the preliminary heating nozzle 29. The slits 17 of the pin spot soldering nozzle 15 and the slits 17 of the preliminary heating nozzle 29 are arranged linearly. Control of the movement of the printed circuit board 11 by the X-Y table 14 and the operations of the molten solder generator 18 and the warm wind generator 30 is performed such that, as shown in FIGS. 10A and 10B, a lead pin 13 to be soldered passes the inside of the preliminary heating nozzle 29 prior to the pin spot soldering nozzle 15.

Due to the construction described above, soldering is performed for each of the lead pins 13 of the post-mounting part 12 immediately after it is preliminarily heated to a predetermined temperature. Consequently, the solder wettability is improved and good soldering can be achieved.

Figure 11:
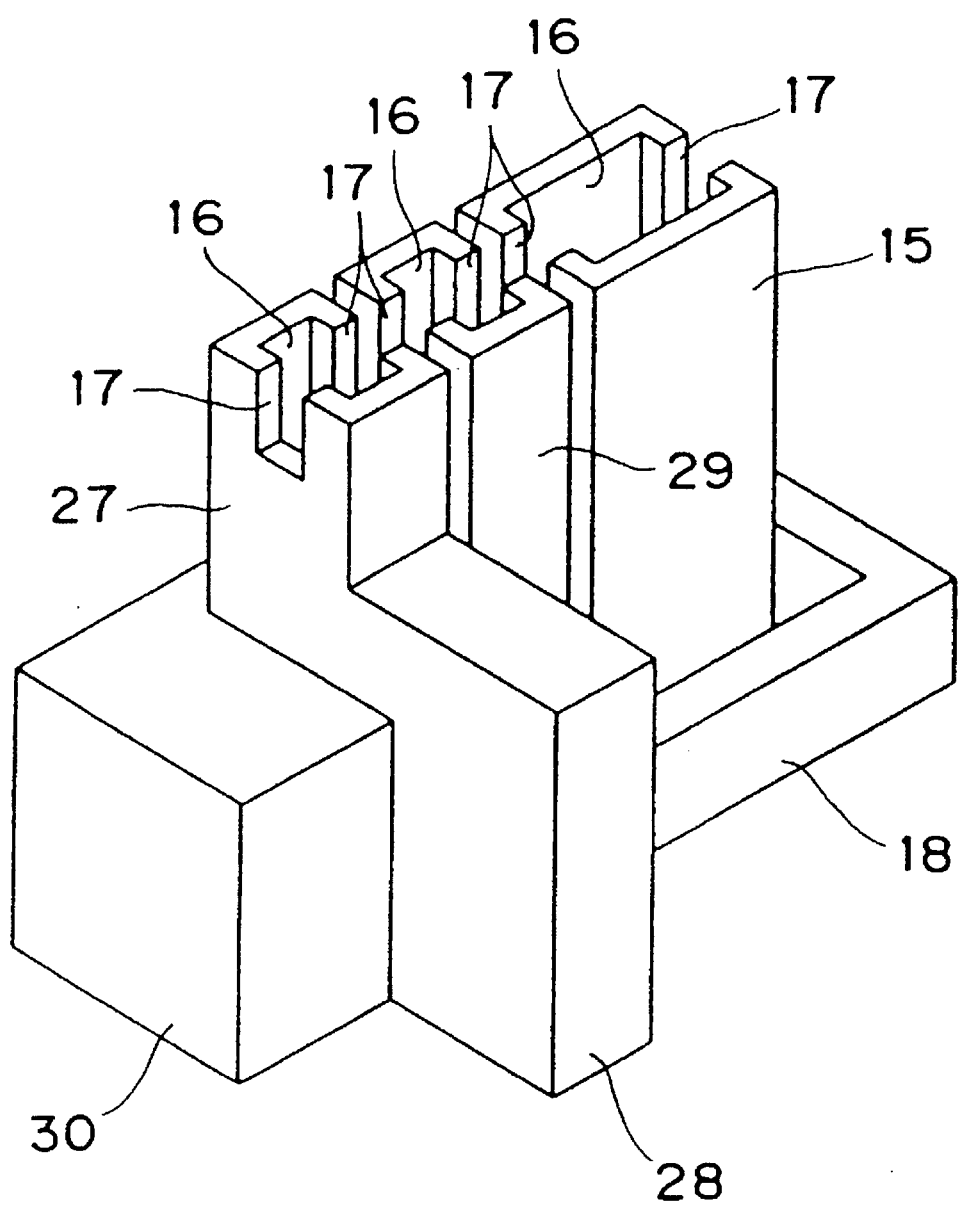
FIG. 11 is a perspective view showing the construction of a sixth embodiment of the present invention.

FIG. 11 is a view showing the construction of a sixth embodiment of the present invention. Substantially the same components as those of the first, fourth and fifth embodiments described above are denoted by same reference numerals, and description of them is omitted herein. While application of flux is performed prior to soldering in the fourth embodiment and preliminary heating is performed prior to soldering in the fifth embodiment described above, in the present embodiment, both the application of flux and preliminary heating are performed prior to soldering.

Figures 12A, 12B:
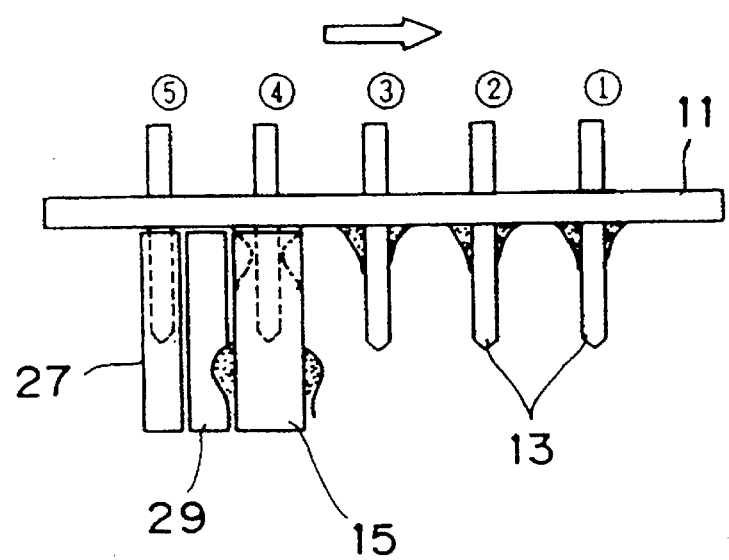
FIG. 12A is a schematic view illustrating movement control of the sixth embodiment of the present invention.
FIG. 12B is a time chart illustrating operation timings of different members of the sixth embodiment of the present invention.

In the present embodiment, a preliminary heating nozzle 29 is arranged adjacent the pin spot soldering nozzle 15 and a flux applying nozzle 27 is arranged adjacent the preliminary heating nozzle 29. It is to be noted that reference numeral 28 denotes a flux generator (fluxer), and 30 denotes a warm wind generator (heater). The slits 17 of the pin spot soldering nozzle 15, the slits 17 of the flux applying nozzle 27 and the slits 17 of the preliminary heating nozzle 29 are arranged linearly as seen in FIG. 11. Control of the movement of the printed circuit board 11 by the X-Y table 14 and the operations of the molten solder generator 18, the flux generator 28 and the warm wind generator 30 is performed such that, as shown in FIGS. 12A and 12B, a lead pin 13 to be soldered first passes the inside of the flux applying nozzle 27 and then passes the inside of the preliminary heating nozzle 29 and finally passes the inside of the pin spot soldering nozzle 15.

Due to the construction described above, soldering is performed for each of the lead pins 13 of the post-mounting part 12 immediately after application of flux to it and preheating of it are performed. Consequently, solder wettability is improved and good soldering can be achieved. Further, when compared with a conventional soldering apparatus wherein the flux application step and the preliminary heating step for improving the solder wettability and so forth are performed independently of the soldering step by individually independent apparatus, the nozzles themselves are reduced in size and are assembled very compact. Consequently, the entire system can be reduced in size and in cost.

Figure 13:
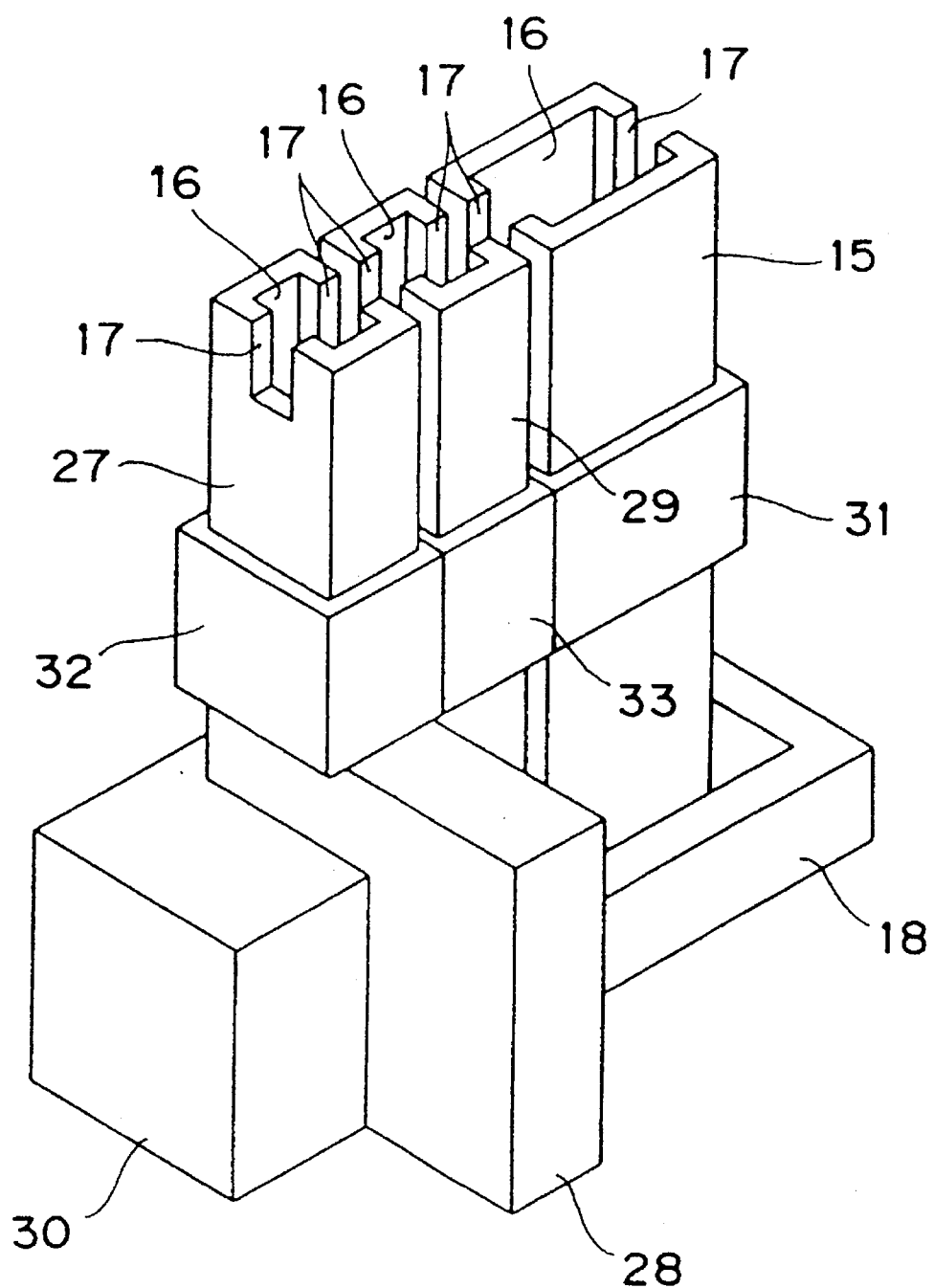
FIG. 13 is a perspective view showing the construction of a seventh embodiment of the present invention.

FIG. 13 is a view showing the construction of a seventh embodiment of the present invention. Substantially the same components as those of the first and sixth embodiments described above are denoted by same reference numerals, and description of them is omitted herein. While the pin spot soldering nozzle 15, the flux applying nozzle 27 and the preliminary heating nozzle 29 shown in the sixth embodiment described above are constructed integrally with one another, the soldering apparatus of the present embodiment includes a pin spot soldering nozzle elevator 31, a flux applying nozzle elevator 32 and a preliminary heating nozzle elevator 33 which are moved upwardly and downwardly independently of one another. The elevators 31, 32 and 33 are controlled based on circuit board data (data regarding parts already mounted on the printed circuit board 11 and data regarding the post-mounting part 12 to be soldered to the printed circuit board 11) by controlling means (not shown). The other construction is similar to that of the sixth embodiment.

Since such elevators 31, 32 and 33 are provided, when a different part is already mounted in the proximity of the post-mounting part 12 to be soldered, soldering can be performed avoiding the already mounted part. In particular, as seen from FIGS. 14A, 14B and 14C, by controlling the movement of the printed circuit board 11 by the X-Y table 14, the operation of the molten solder generator 18, the operation of the flux generator 28, the operation of the warm wind generator 30 and the operations of the elevators 31, 32 and 33, good soldering can be performed while avoiding the already mounted part 34. Consequently, even when the printed circuit board 11 which is an object of soldering is a highly densely mounted circuit board, the soldering apparatus can cope with the printed circuit board 11.

Figure 15:
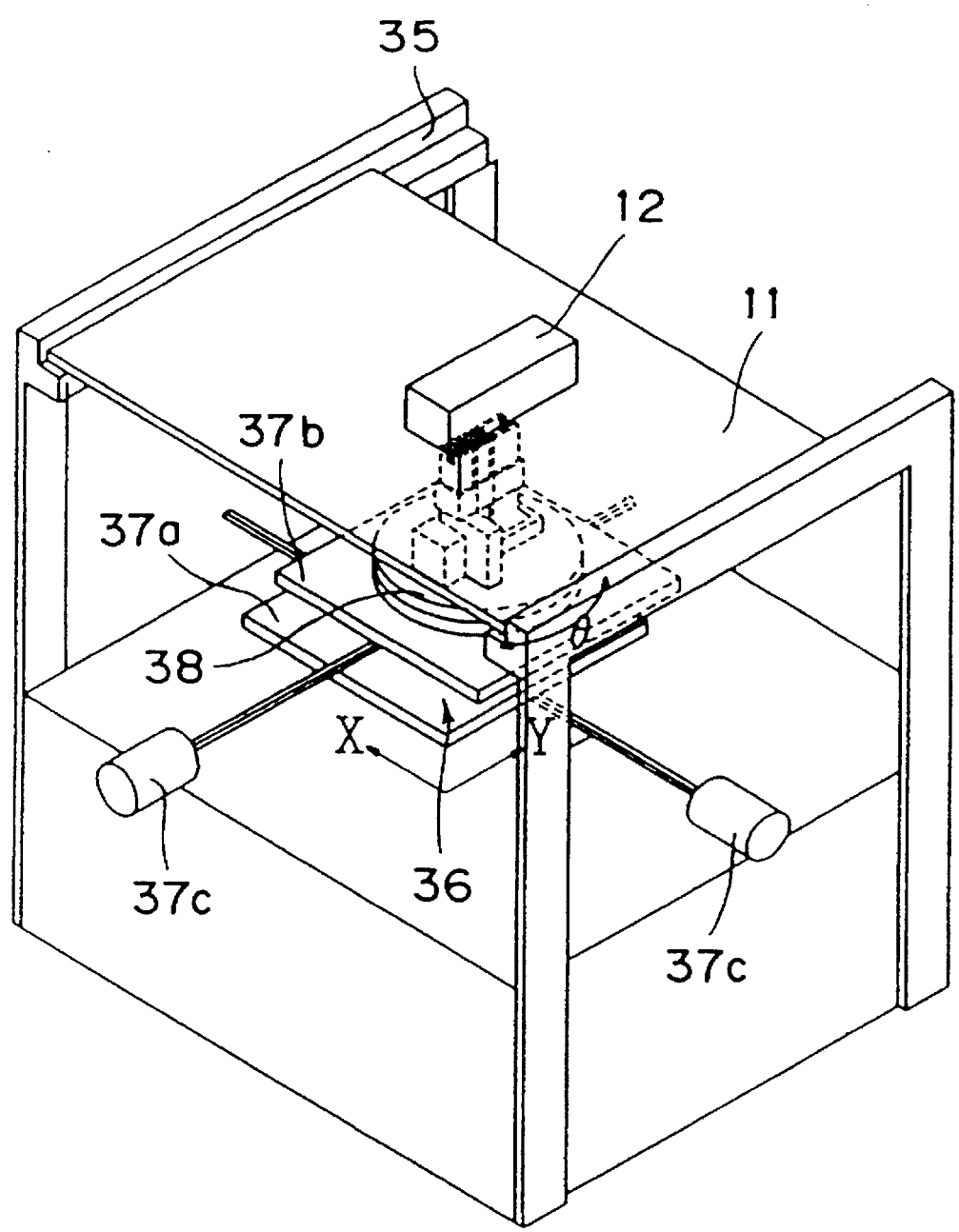
FIG. 15 is a perspective view of the entire construction of an eighth embodiment of the present invention.
Figure 16:
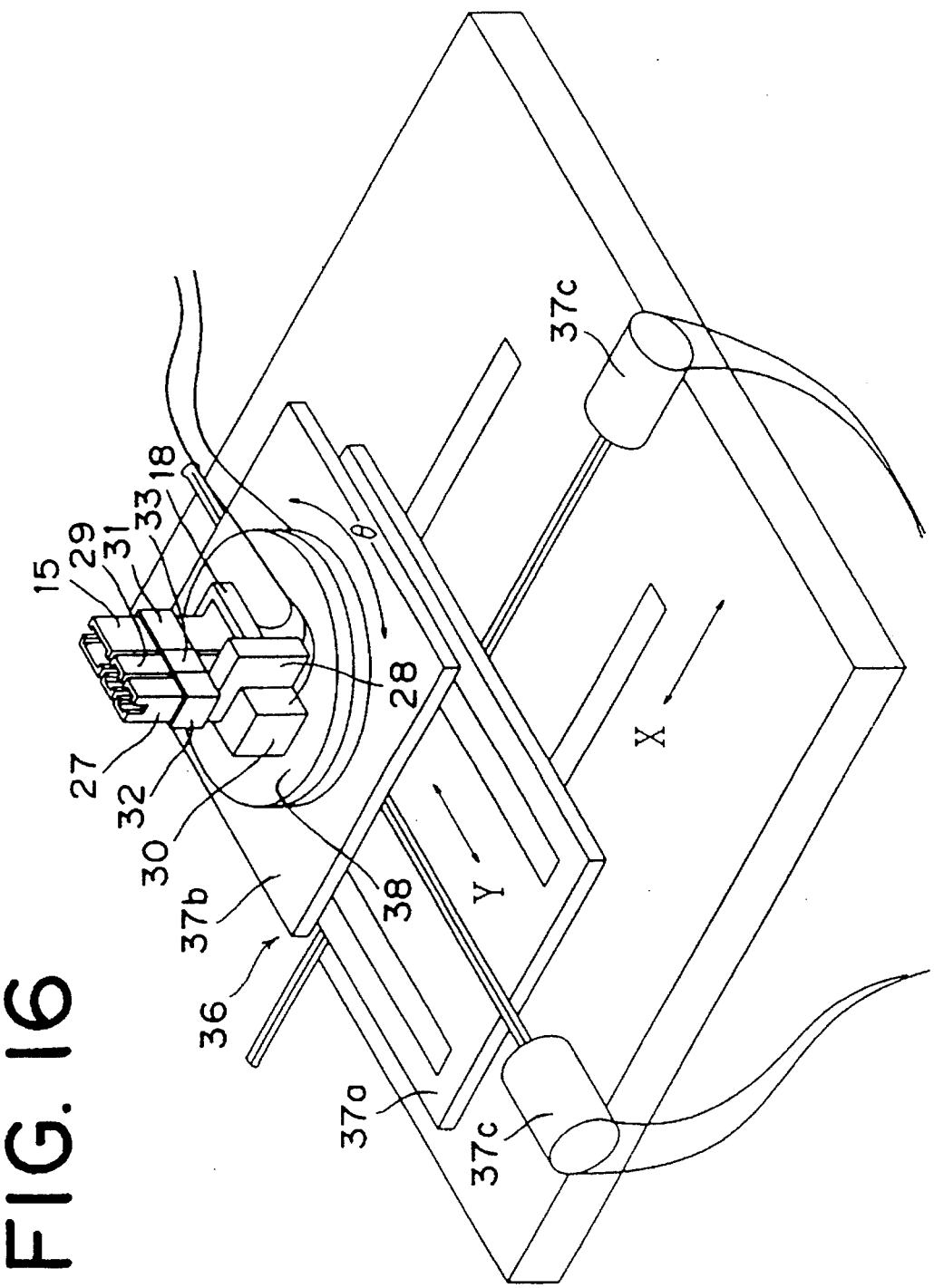
FIG. 16 is a perspective view showing part of the eighth embodiment of the present invention in an enlarged scale.

FIG. 15 is a view showing the entire construction of an eighth embodiment of the present invention, and FIG. 16 is a partially enlarged view of FIG. 15. Substantially the same components as those of the first and seventh embodiments described above are denoted by same reference numerals, and description of them is omitted herein. Referring to FIGS. 15 and 16, reference numeral 11 denotes a printed circuit board. A post-mounting part (for example, multiple pin connector) 12 having a plurality of lead pins 13 is temporarily fastened to the printed circuit board 11 in a condition wherein the lead pins 13 thereof are inserted from above in through-holes formed in the printed circuit board 11. The printed circuit board 11 is carried in and out along a guide 35 by conveyor means not shown. Reference numeral 36 denotes an X-Y table constituted from an X-table 37a which is moved in a horizontal one-axis direction (X direction) by a drive motor 37c and a Y-table 37b which is moved in another horizontal one-axis direction (Y direction) by a drive motor 37c. Reference numeral 38 denotes a turntable, and the turntable 38 is located on the Y-table 37b of the X-Y table 36.

A pin spot soldering nozzle 15, a flux applying nozzle 27 and a preliminary heating nozzle 29 which are similar to those of the seventh embodiment described above are carried on the turntable 38 together with a molten solder generator 18, a flux generator 28 and a warm wind generator 30, respectively. It is to be noted that, similarly as in the seventh embodiment, the pin spot soldering nozzle 15, the flux applying nozzle 27 and the preliminary heating nozzle 29 are moved in upward and downward directions (Z direction) independently of one another by a pin spot soldering nozzle elevator 31, a flux applying nozzle elevator 32 and a preliminary heating nozzle elevator 33, respectively. The operation of moving means constituted from the conveyor means, the X-Y table 36, the turntable 38 and the elevators 31, 32 and 33 described above and the operations of the molten solder generator 18, the flux generator 28 and the warm wind generator 30 are controlled by controlling means (not shown).

Figure 17A:
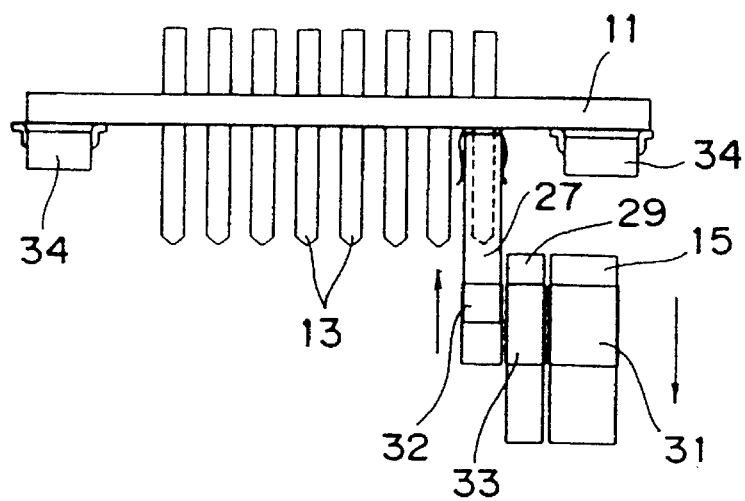
FIGS. 17A, 17B and 17C and FIGS. 18A and 18B are schematic views illustrating movement control of the eighth embodiment of the present invention when an already mounted part is present.

Such control proceeds, for example, in such a manner as described below. The control will be described with reference to FIGS. 17A, 17B, 17C, 18A and 18B. It is to be noted that those figures illustrate the processing where a different already mounted part 34 is mounted in the proximity of the post-mounting part 12 to be soldered but on the rear face side of the printed circuit board 11. First, the turntable 38 is rendered operative to suitably set the postures of the pin spot soldering nozzle 15, the flux applying nozzle 27 and the preliminary heating nozzle 29, and then the X-Y table 36 is activated to position the flux applying nozzle 27 at a location below a first one of the lead pins 13 of the post-mounting part 12. Then, the flux applying nozzle elevator 32 is activated to move up the flux applying nozzle 27 as shown in FIG. 17A, and the flux generator 28 is activated. Thereafter, the X-Y table 36 is activated to move the flux applying nozzle 27 so that a lead pin 13 may pass through one of the slits 17 of the flux applying nozzle 27 and flux is applied to the first lead pins 13.

Figure 17B:
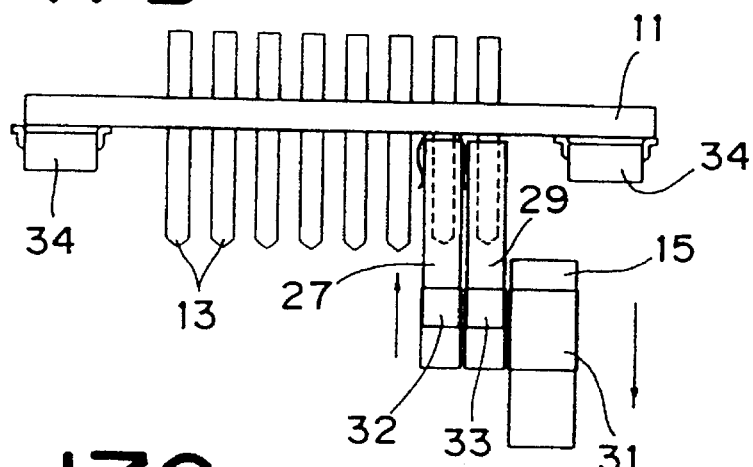
Figure 17C:
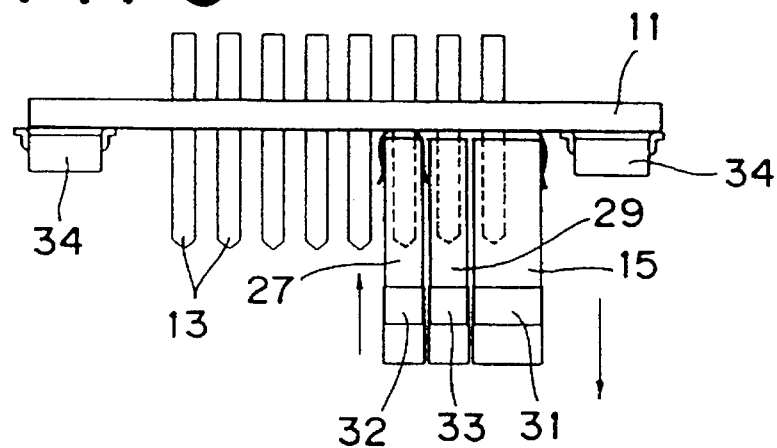

Then, after the first lead pin 13 passes through the other slit 17 of the flux applying nozzle 27, the preliminary heating nozzle elevator 33 is activated to move up the preliminary heating nozzle 29 as shown in FIG. 17B, and the warm wind generator 30 is activated. Consequently, the first lead pin 13 passes through the one slit 17 of the preliminary heating nozzle 29 so that it is preliminarily heated by the preliminary heating nozzle 29. In this instance, the flux applying nozzle 27 applies flux to a second one of the lead pins 13 in a similar manner as described above. After the first lead pin 13 passes through the other slit 17 of the preliminary heating nozzle 29, the pin spot soldering nozzle elevator 31 is activated to move up the pin spot soldering nozzle 15, as shown in FIG. 17C, and the molten solder generator 18 is activated. Consequently, the first lead pin 13 passes through one of the slits 17 of the pin spot soldering nozzle 15 so that the first lead pin 13 is soldered. In this instance, the preliminary heating nozzle 29 preliminarily heats the second lead pin 13 in a manner similar to that described above, and the flux applying nozzle 27 applies flux to a third one of the lead pins 13 in a manner similar to that described above.

Figure 18A:
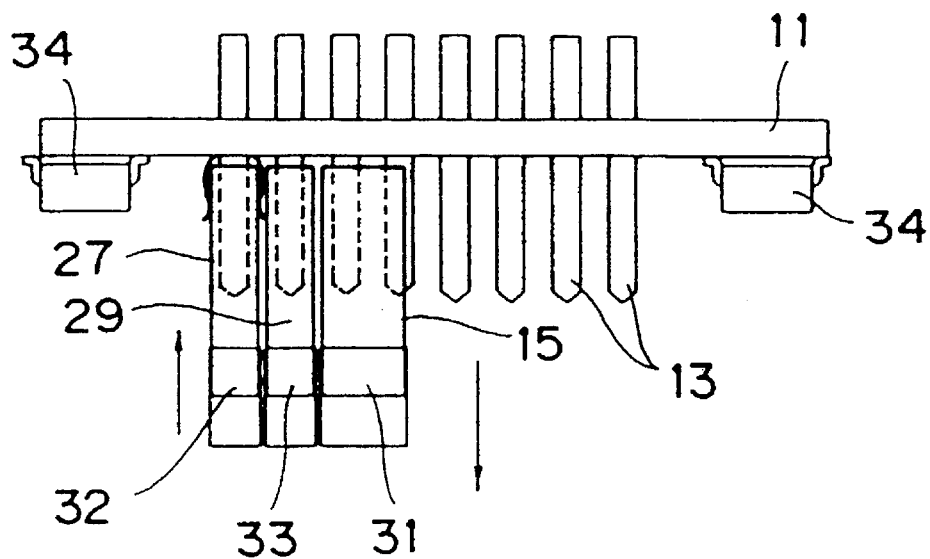
Figure 18B:
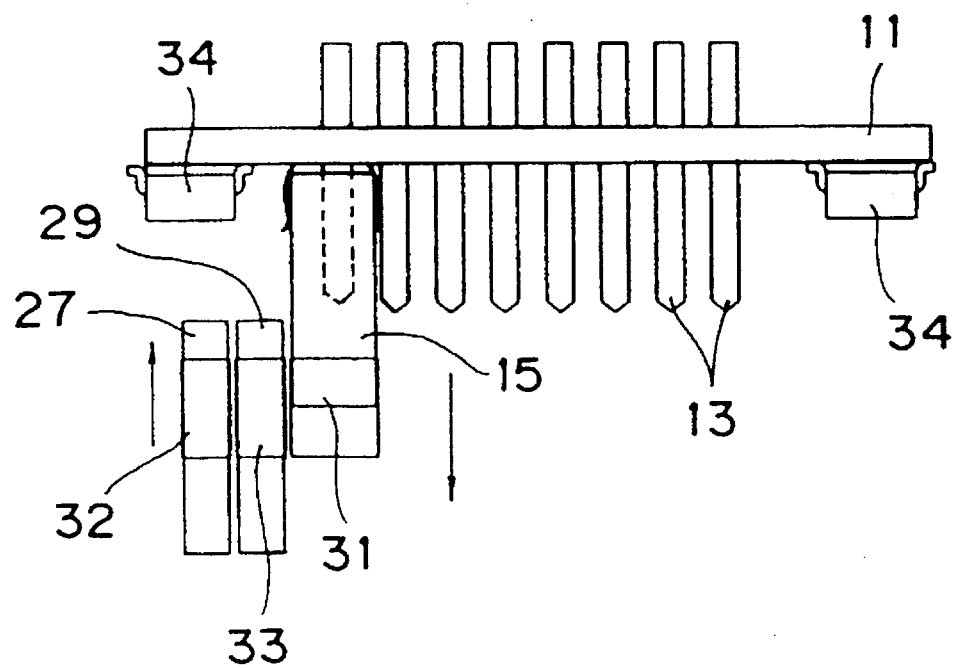

As the operation of the X-Y table 36 is continued while keeping this condition, soldering of the second and following lead pins 13 is performed successively as seen from FIG. 18A. Thereafter, at a point in time when application of flux to and preheating and soldering of the last lead pin 13 have been performed by the flux applying nozzle 27, the preliminary heating nozzle 29 and the pin spot soldering nozzle 15, respectively, the flux applying nozzle 27 is moved down by the flux applying nozzle elevator 32; the preliminary heating nozzle 29 is moved down by the preliminary heating nozzle elevator 33; and the pin spot soldering nozzle 15 is moved downward by the pin spot soldering nozzle elevator 31. Soldering of all of the lead pins 13 of the post-mounting part 12 is thereby completed. When the printed circuit board 11 includes some other post-mounting part or parts 12 thereon, similar processing is performed for them. After all necessary processing for the printed circuit board 11 is completed, the printed circuit board 11 is carried out by the conveyor means while a next printed circuit board 11 is carried in. Then, similar processing is repeated for the next printed circuit board 11. In this manner, soldering operations for post-mounting parts are automatically performed successively.

With the construction of the present embodiment employed, a soldering operation for soldering post-mounting parts 12 to a plurality of printed circuit boards 11 can be fully automated, which remarkably improves the operation efficiency remarkably. Further, according to the present embodiment, even when a change of design of a printed circuit board is performed or when soldering of a post-mounting part to a printed circuit board of a different specification is necessitated, the soldering apparatus can cope with the case flexibly by changing the circuit board data or replacing the circuit board data with those for the different specification. Consequently, a change of the setup such as replacement of a nozzle or some other element can be minimized, and the soldering apparatus is very high in universality.

Figure 19:
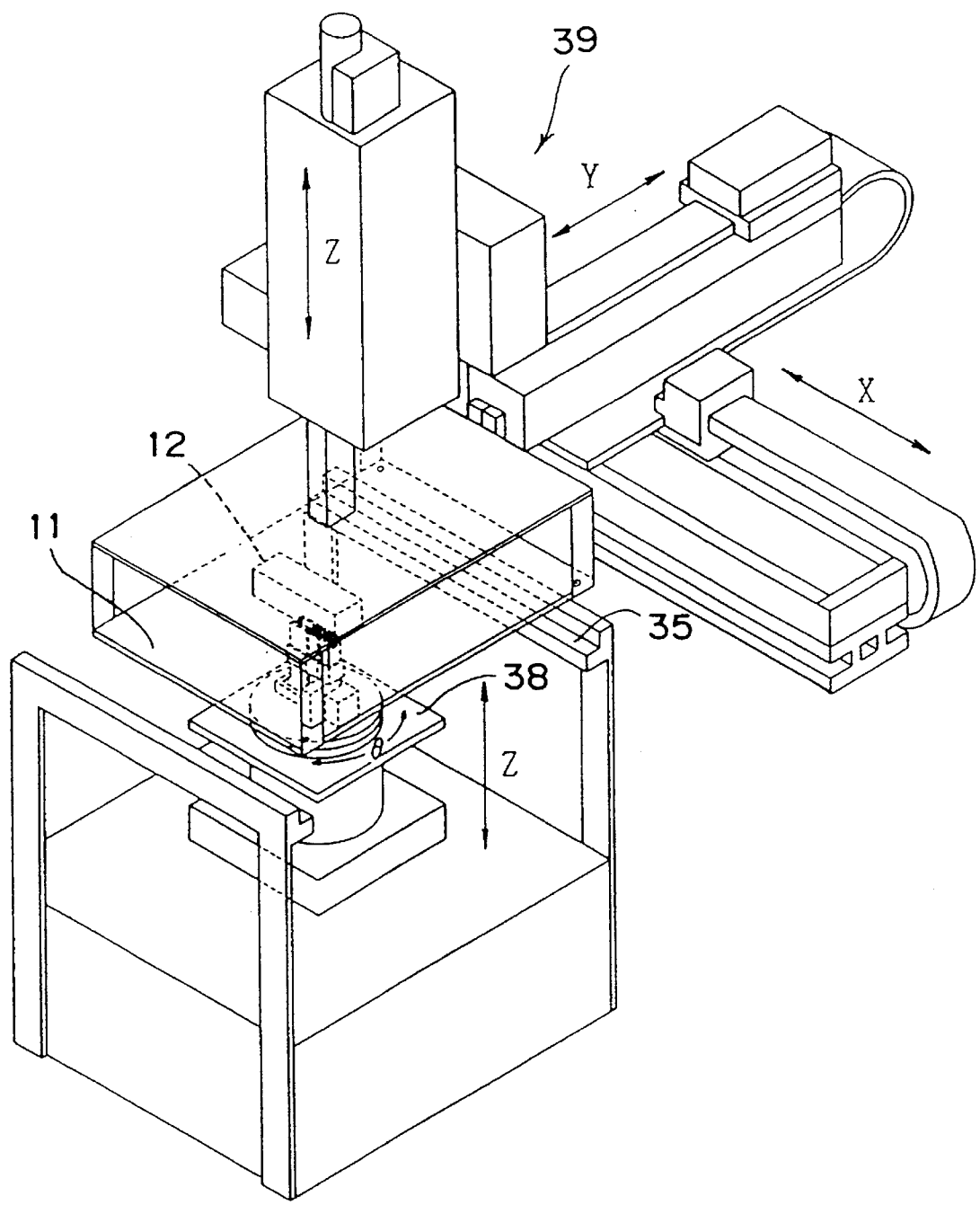
FIG. 19 is a perspective view showing the construction of a ninth embodiment of the present invention.
Figure 20:
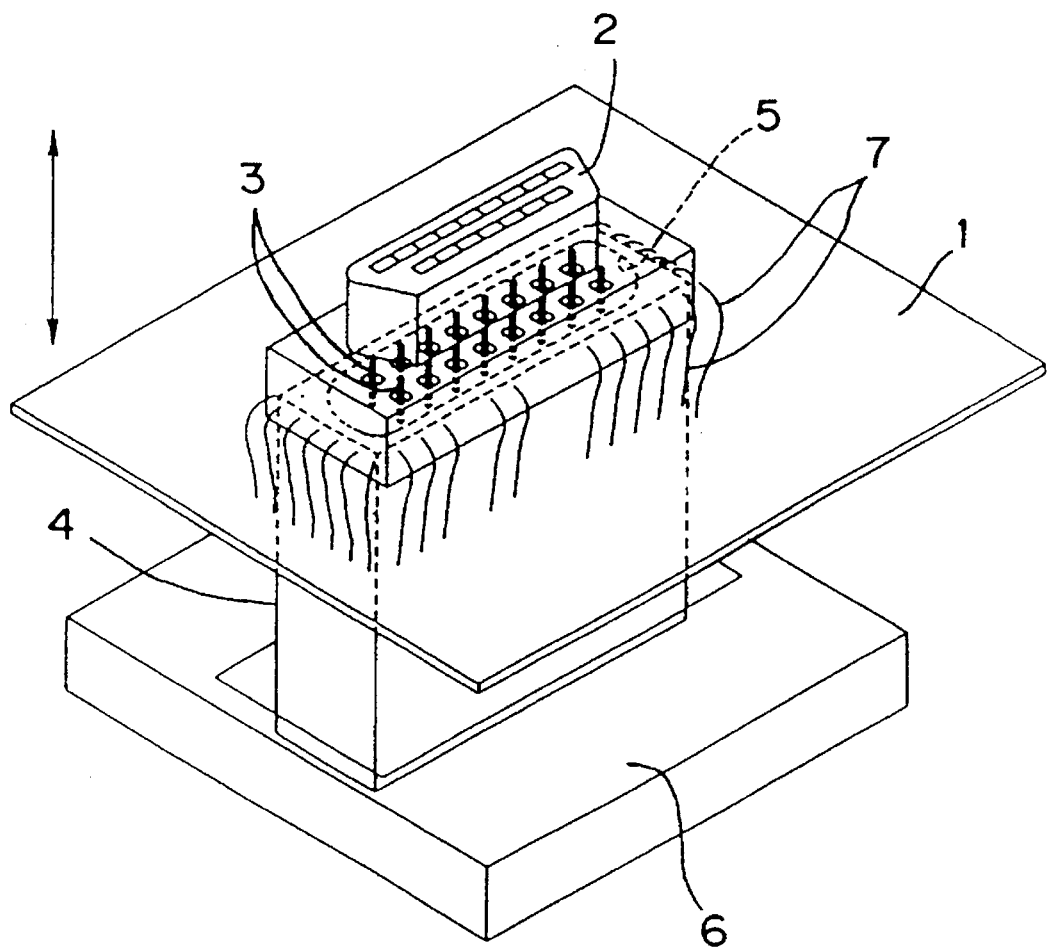
FIG. 20 is a perspective view showing the construction of a conventional soldering apparatus.
Figure 21A:
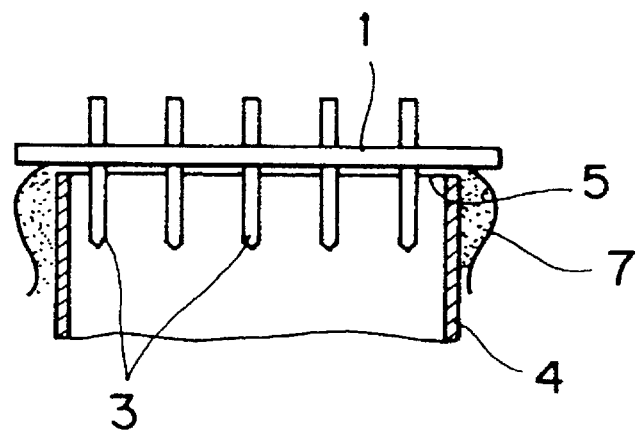
FIG. 21A is a schematic view showing a condition during soldering of the conventional soldering apparatus.
Figure 21B:
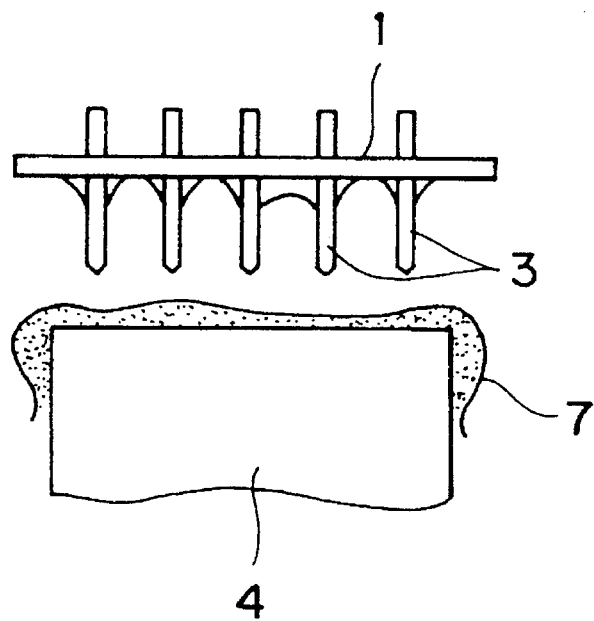
FIG. 21B is a schematic view showing a condition after soldering of the conventional soldering apparatus.

FIG. 19 is a view showing the entire construction of a ninth embodiment of the present invention. Substantially the components as those of the eighth embodiment described above are denoted by same reference numerals, and description of them is omitted herein. The present embodiment is constructed such that the X-Y table 36 and the conveyor means for transporting a printed circuit board 11 are eliminated from the construction of the eighth embodiment described above, and instead, it additionally includes a moving robot 39 for moving the printed circuit board 11 in horizontal two-axis directions (X direction and Y direction) and a vertical one-axis direction (Z axis direction). The other construction and effects are similar to those of the eighth embodiment.

In the embodiments described above, when an already mounted part is located in the proximity of a post-mounting part to be soldered, the already mounted part is detected based on circuit board data and a soldering operation is performed while avoiding the already mounted part by means of controlling means. However, such a case that the position of an actually mounted part or the like is different from circuit board data or an obstacle suddenly appears may possibly occur. In such a case, the pin spot soldering nozzle or some other element may collide with the obstacle, making it unavoidable to stop the apparatus. However, such a situation must be eliminated from the point of view of the safety, the production efficiency or the like. Accordingly, although not shown, a soldering apparatus should be constructed such that sensor means such as an optical sensor for detecting an obstacle is provided in the proximity of the pin spot soldering nozzle 15, and when an obstacle is detected, if the soldering operation can be continued avoiding the obstacle, the operation is continued while avoiding the obstacle, but if the soldering operation cannot be continued, an alarm is developed. Due to the construction, an automatic soldering apparatus is provided which can and efficiently perform soldering.

What is claimed is:

1. A soldering apparatus wherein lead pins of a part inserted from above in through-holes of a printed circuit board are soldered to the through-holes from below, comprising:

pin spot soldering means having, at an upper portion thereof, an opening for injecting molten solder therethrough and a slit extending downwardly from said opening in such a manner so as to allow the lead pins to pass sidewardly therethrough;

molten solder supplying means for supplying molten solder to said opening of said pin spot soldering means;

moving means for moving and positioning a relative position of said pin spot soldering means to the printed circuit board; and controlling means for controlling the movement by said moving means in accordance with circuit board data regarding the printed circuit board.

2. A soldering apparatus according to claim 1, wherein said pin spot soldering means includes a barrier located of inside of said opening and open only at a portion thereof adjacent said slit and at the top thereof.

3. A soldering apparatus according to claim 1, wherein said pin spot soldering means has a pair of slits disposed at symmetrical positions with respect to a center axis of said pin spot soldering means in the vertical direction.

4. A soldering apparatus according to claim 1, wherein said controlling means controls said moving means so that the lead pins of the lead part passes sidewardly through said slit of said pin spot soldering means.

5. A soldering apparatus according to claim 1, wherein said moving means includes X-Y table means for moving the printed circuit board in horizontal two-axis directions.

6. A soldering apparatus according to claim 1, wherein said moving means includes X-Y table means for moving said pin spot soldering means in horizontal two-axis directions.

7. A soldering apparatus according to claim 1, wherein said moving means includes elevating means for moving said pin spot soldering means in a vertical one-axis direction.

8. A soldering apparatus according to claim 1, further comprising:

flux applying nozzle means disposed adjacent said pin spot soldering means and having, at an upper portion thereof, an opening for supplying flux therethrough and a slit extending downwardly from said opening in such a manner as to allow the lead pins to pass sidewardly therethrough; and flux supplying means for supplying flux to said opening of said flux applying nozzle means.

9. A soldering apparatus according to claim 1, further comprising:

preliminary heating nozzle means disposed adjacent said pin spot soldering means and having, at an upper portion thereof, an opening for injecting a warm wind therethrough and a slit extending downwardly from said opening in such a manner as to allow the lead pins to pass sidewardly therethrough; and preliminary heating heater means for supplying a warm wind to said opening of said preliminary heating nozzle means.

10. A soldering apparatus wherein lead pins of a part inserted from above in through-holes of a printed circuit board are soldered to the through-holes from below, comprising:

pin spot soldering means having, at an upper portion thereof, an opening for injecting molten solder therethrough and a slit extending downwardly from said opening in such a manner as to allow the lead pins to pass sidewardly therethrough;

molten solder supplying means for supplying molten solder to said opening of said pin spot soldering means;

preliminary heating nozzle means disposed adjacent said pin spot soldering means and having, at an upper portion thereof, an opening for injecting a warm wind therethrough and a slit extending downwardly from said opening in such a manner as to allow the lead pins to pass sidewardly therethrough;

preliminary heating heater means for supplying a warm wind to said opening of said preliminary heating nozzle means;

flux applying nozzle means disposed adjacent said preliminary heating nozzle means and having, at an upper portion thereof, an opening for supplying flux therethrough and a slit extending downwardly from said opening in such a manner as to allow the lead pins to pass sidewardly therethrough;

flux supplying means for supplying flux to said opening of said flux applying nozzle means;

moving means for moving and positioning relative positions of said pin spot soldering means, said flux applying nozzle means and said preliminary heating nozzle means to the printed circuit board; and controlling means for controlling the movement by said moving means in accordance with circuit board data regarding the printed circuit board.

11. A soldering apparatus according to claim 10, wherein each of said pin spot soldering means, said flux applying nozzle means and said preliminary heating nozzle means has a pair of slits, and all of the slits are arranged linearly.

12. A soldering apparatus according to claim 10, wherein said moving means includes elevating means for moving said pin spot soldering means, said flux applying nozzle means and said preliminary heating nozzle means integrally in a vertical one-axis direction.

13. A soldering apparatus according to claim 10, wherein said moving means includes elevating means for moving said pin spot soldering means, said flux applying nozzle means and said preliminary heating nozzle means independently of one another in a vertical one-axis direction.

14. A soldering apparatus according to claim 13, wherein said controlling means detects an already mounted part on the printed circuit board based on the circuit board data regarding the printed circuit board and controls said elevating means independently of one another so that said pin spot soldering means, said flux applying nozzle means or said preliminary heating nozzle means may avoid the already mounted part.

15. A soldering apparatus according to claim 10, wherein said moving means includes X-Y table means for moving said pin spot soldering means, said flux applying nozzle means and said preliminary heating nozzle means in horizontal two-axis directions.

16. A soldering apparatus according to claim 10, wherein said moving means includes turntable means for rotating said pin spot soldering means, said flux applying nozzle means and said preliminary heating nozzle means.

17. A soldering apparatus according to claim 10, wherein said moving means includes moving robot means for moving the printed circuit board in perpendicular three-axis directions.

18. A soldering apparatus according to claim 10, further comprising:

sensor means disposed adjacent said pin spot soldering means for detecting presence or absence of an obstacle including a part mounted on a lower face of the printed circuit board;

said controlling means for controlling said moving means so that said pin spot soldering means, said flux applying nozzle means or said preliminary heating nozzle means are prevented from colliding with the obstacle.

\* \* \* \* \*